(12) United States Patent
Kwon et al.

(10) Patent No.: US 12,205,904 B2
(45) Date of Patent: Jan. 21, 2025

(54) WAFER-LEVEL DESIGN AND WIRING PATTERN FOR A SEMICONDUCTOR PACKAGE

(71) Applicant: Nepes Co., Ltd., Chungcheongbuk-do (KR)

(72) Inventors: Yong Tae Kwon, Cheongju-si (KR); Jun Kyu Lee, Cheongju-si (KR); Dong Hoon Oh, Seoul (KR); Su Yun Kim, Cheongju-si (KR); Kyeong Rok Shin, Gwangju (KR)

(73) Assignee: Nepes Co., Ltd., Chungcheongbuk-do (KR)

( * ) Notice: Subject to any disclaimer, the term of this patent is extended or adjusted under 35 U.S.C. 154(b) by 972 days.

(21) Appl. No.: 17/280,288

(22) PCT Filed: Sep. 26, 2019

(86) PCT No.: PCT/KR2019/012503
§ 371 (c)(1),
(2) Date: Mar. 26, 2021

(87) PCT Pub. No.: WO2020/067732
PCT Pub. Date: Apr. 2, 2020

(65) Prior Publication Data
US 2021/0343656 A1 Nov. 4, 2021

(30) Foreign Application Priority Data

Sep. 28, 2018 (KR) .................. 10-2018-0116585
Feb. 14, 2019 (KR) .................. 10-2019-0017395

(51) Int. Cl.
*H01L 23/52* (2006.01)
*H01L 23/00* (2006.01)
(Continued)

(52) U.S. Cl.
CPC ........ *H01L 23/552* (2013.01); *H01L 23/5226* (2013.01); *H01L 23/5283* (2013.01);
(Continued)

(58) Field of Classification Search
CPC ... H01L 2224/02313; H01L 2224/0236; H01L 2224/0231
See application file for complete search history.

(56) References Cited

U.S. PATENT DOCUMENTS 7,825,495 B2    11/2010  Ryu et al.
9,123,543 B1 *   9/2015  Jin ...................... H01L 23/3192
(Continued)

FOREIGN PATENT DOCUMENTS

KR      10-0787894 B1     12/2007
KR    10-2008-0011617 A    2/2008
(Continued)

OTHER PUBLICATIONS

Amirzada, Muhammad & Tatzel, Andreas & Viereck, Volker & Hillmer, Hartmut. (2015). Surface roughness analysis of SiO2 for PECVD, PVD and IBD on different substrates. Applied Nanoscience. 6. 10.1007/s13204-015-0432-8. (Year: 2015).*

(Continued)

*Primary Examiner* — Nicholas J Tobergte
(74) *Attorney, Agent, or Firm* — Crowell & Moring LLP

(57) ABSTRACT

A semiconductor package includes a semiconductor chip including a chip pad, a first insulating layer provided on the semiconductor chip and including a first via hole, a first wiring pattern provided on the first insulating layer and connected to the chip pad through the first via hole of the first insulating layer, a second insulating layer provided on the first insulating layer and the first wiring pattern and including a second via hole, and a second wiring pattern provided on the second insulating layer and connected to the (Continued)

first wiring pattern through the second via hole of the second insulating layer, wherein the first insulating layer includes a first upper surface in contact with the second insulating layer and a first lower surface opposite to the first upper surface, and the first upper surface of the first insulating layer has surface roughness greater that the first lower surface of the first insulating layer.

10 Claims, 18 Drawing Sheets

(51) Int. Cl.
*H01L 23/522* (2006.01)
*H01L 23/528* (2006.01)
*H01L 23/552* (2006.01)

(52) U.S. Cl.
CPC .............. *H01L 24/13* (2013.01); *H01L 24/94* (2013.01); *H01L 2224/13022* (2013.01); *H01L 2924/3025* (2013.01)

(56) References Cited

U.S. PATENT DOCUMENTS

| | | | |
|---|---|---|---|
| 9,837,360 | B2 | 12/2017 | Choi et al. |
| 10,115,686 | B2 * | 10/2018 | Huang .................... H01L 24/02 |
| 10,262,949 | B2 | 4/2019 | Park et al. |
| 10,804,146 | B2 | 10/2020 | Kim et al. |
| 11,270,953 | B2 * | 3/2022 | Chuang ............. H01L 23/49816 |
| 2007/0102815 | A1 * | 5/2007 | Kaufmann .............. H01L 24/11 |
| | | | 257/737 |
| 2011/0042797 | A1 * | 2/2011 | Park ...................... H01L 21/563 |
| | | | 257/E23.06 |
| 2016/0172287 | A1 * | 6/2016 | Arisaka .................. H05K 1/181 |
| | | | 257/774 |
| 2016/0192482 | A1 * | 6/2016 | Radi ...................... H05K 3/048 |
| | | | 174/257 |
| 2019/0198429 | A1 * | 6/2019 | Kang ...................... H01L 23/34 |
| 2023/0253447 | A1 * | 8/2023 | Kim ........................ H01L 28/65 |
| | | | 438/239 |

FOREIGN PATENT DOCUMENTS

| | | |
|---|---|---|
| KR | 10-2016-0132751 A | 11/2016 |
| KR | 10-2017-0070779 | 6/2017 |
| KR | 10-2018-0084590 A | 7/2018 |

OTHER PUBLICATIONS

International Search Report for corresponding International Application No. PCT/KR2019/012503, mailed Jan. 6, 2020 (with English Translation).

Notice of Allowance for Korean Application No. 10-2019-0017395, dated Jan. 4, 2021, 3 pgs. (with English machine translation).

Notice of Opinion Submission for Korean Application No. 10-2019-0017395, dated Jun. 1, 2020, 5 pgs. (with English machine translation).

Written Opinion for corresponding International Application No. PCT/KR2019/012503, mailed Jan. 6, 2020 (with English machine translation).

* cited by examiner

WAFER-LEVEL DESIGN AND WIRING PATTERN FOR A SEMICONDUCTOR PACKAGE

CROSS REFERENCE TO RELATED APPLICATIONS

This application is the U.S. National Stage application of PCT application no. PCT/KR2019/012503, filed on Sep. 26, 2019, titled "Semiconductor Package," designating the United States the content of which is incorporated herein by reference in its entirety. PCT application no. PCT/KR2019/012503 claims priority from Korean Patent Application no. 10-2019-0017395 filed on Feb. 14, 2019 the content of which is incorporated herein by reference in its entirety. PCT application no. PCT/KR2019/012503 also claims priority to Korean Patent Application no. 10-2018-0116585 filed on Sep. 28, 2018, the content of which is incorporated herein by reference in its entirety.

TECHNICAL FIELD

The disclosure relates to a semiconductor package, and more particularly, to a wafer-level package.

BACKGROUND ART

Generally, semiconductor packages are manufactured by performing a semiconductor package process on semiconductor chips that are manufactured by performing various semiconductor processes on a wafer. Recently, to reduce manufacturing costs of semiconductor packages, a wafer-level package technology has been suggested, in which a semiconductor package process is performed at a wafer level and a wafer-level semiconductor package that passed through the semiconductor package process is individualized into individual units.

DESCRIPTION OF EMBODIMENTS

Technical Problem

Provided is a semiconductor package with high reliability.

Solution to Problem

According to an aspect of the present disclosure, a semiconductor package includes a semiconductor chip including a chip pad, a first insulating layer provided on the semiconductor chip and including a first via hole, a first wiring pattern provided on the first insulating layer and connected to the chip pad through the first via hole of the first insulating layer, a second insulating layer provided on the first insulating layer and the first wiring pattern and including a second via hole, and a second wiring pattern provided on the second insulating layer and connected to the first wiring pattern through the second via hole of the second insulating layer, wherein the first insulating layer includes a first upper surface in contact with the second insulating layer and a first lower surface opposite to the first upper surface, and the first upper surface of the first insulating layer has surface roughness greater that the first lower surface of the first insulating layer.

Advantageous Effects of Disclosure

According to the disclosure, as a first insulating layer and/or a second insulating layer are relatively thick so as to function as a buffer to external shocks, reliability of a semiconductor package may be enhanced.

Furthermore, according to the disclosure, as an upper surface of the first insulating layer and/or an upper surface of the second insulating layer have relatively large surface roughness, adhesion between the first insulating layer and a first wiring pattern and/or adhesion between the second insulating layer and a second wiring pattern may be enhanced.

BEST MODE

Figure 1:
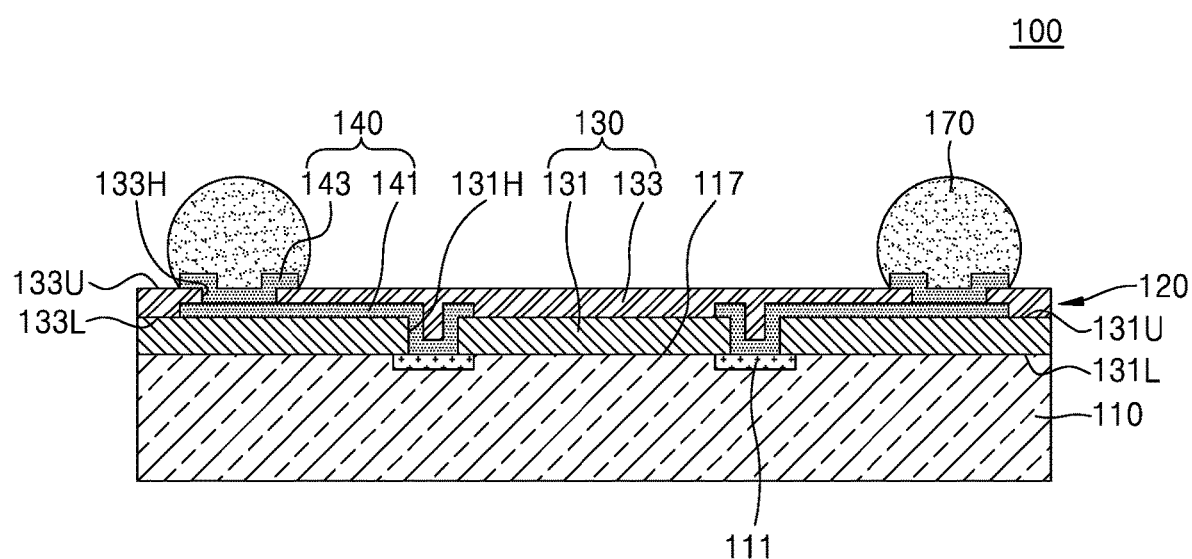
FIG. 1 is a cross-sectional view of a semiconductor package according to an embodiment of the disclosure.

A semiconductor package includes a semiconductor chip including a chip pad, a first insulating layer provided on the semiconductor chip and including a first via hole, a first wiring pattern provided on the first insulating layer and connected to the chip pad through the first via hole of the first insulating layer, a second insulating layer provided on the first insulating layer and the first wiring pattern and including a second via hole, and a second wiring pattern provided on the second insulating layer and connected to the first wiring pattern through the second via hole of the second insulating layer, wherein the first insulating layer includes a first upper surface in contact with the second insulating layer and a first lower surface opposite to the first upper surface, and the first upper surface of the first insulating layer has surface roughness greater that the first lower surface of the first insulating layer.

Mode of Disclosure

The disclosure will now be described more fully with reference to the accompanying drawings, in which embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those of ordinary skill in the art. In the drawings, the thicknesses of layers and regions are exaggerated for clarity. Furthermore, various components and regions are schematically drawn in the drawings. Accordingly, the inventive concept is not limited to relative sizes or intervals drawn in the accompanying drawings.

Terms such as "first" and "second" are used herein merely to describe a variety of constituent elements, but the constituent elements are not limited by the terms. Such terms are used only for the purpose of distinguishing one constituent element from another constituent element. For example, without departing from the right scope of the disclosure, a first constituent element may be referred to as a second constituent element, and vice versa.

Terms used in the specification are used for explaining a specific embodiment, not for limiting the disclosure. Thus, the expression of singularity in the specification includes the expression of plurality unless clearly specified otherwise in context. Also, terms such as "comprise" and/or "comprising" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Unless defined otherwise, all terms used herein including technical or scientific terms have the same meanings as those generally understood by those of ordinary skill in the art to which the disclosure may pertain. Furthermore, the terms as those defined in generally used dictionaries are construed to have meanings matching that in the context of related technology and, unless clearly defined otherwise, are not construed to be ideally or excessively formal.

FIG. 1 is a cross-sectional view of a semiconductor package 100 according to an embodiment of the disclosure.

Referring to FIG. 1, the semiconductor package 100 may include a semiconductor chip 110 and a redistribution structure 120 on the semiconductor chip 110.

Various types of a plurality of individual devices may be formed on the semiconductor chip 110. For example, the individual devices may include various microelectronic devices, for example, metal-oxide-semiconductor field effect transistors (MOSFETs) such as complementary metal-insulator-semiconductor (CMOS) transistors and the like, system large scale integration (LSI), image sensors such as CMOS imaging sensors (CISs) and the like, micro-electromechanical systems (MEMSs), active devices, passive devices, and the like.

The semiconductor chip 110 may include a chip pad 111 on a first surface 117 thereof. The chip pad 111 may be electrically connected to a semiconductor device formed on the semiconductor chip 110. Furthermore, in detail, although not illustrated, the semiconductor chip 110 may include a passivation film that covers the first surface 117.

In some embodiments, the semiconductor chip 110 may include, for example, a memory semiconductor chip. The memory semiconductor chip 110 may include, for example, volatile memory semiconductor chips such as dynamic random access memory (DRAM) or static random access memory (SRAM), or non-volatile memory semiconductor chips such as phase-change random access memory (PRAM), magnetoresistive random access memory (MRAM), ferroelectric random access memory (Fe RAM) or resistive random access memory (RRAM).

Alternatively, in some embodiments, the semiconductor chip 110 may include a logic chip. For example, the semiconductor chip 110 may include a central processor unit (CPU), a microprocessor unit (MPU), a graphic processor unit (GPU), or an application processor (AP).

Furthermore, although FIG. 1 illustrates that the semiconductor package 100 includes one semiconductor chip, the semiconductor package 100 may include two or more semiconductor chips. The two or more semiconductor chips included in the semiconductor package 100 may be homogeneous semiconductor chips or heterogeneous semiconductor chips. In some embodiments, the semiconductor package 100 may include a system in package (SIP) in which different types of semiconductor chips are electrically connected to each other to operate as one system.

The redistribution structure 120 may be provided on the first surface 117 of the semiconductor chip 110. The redistribution structure 120 may include an insulating layer 130 and a wiring pattern 140.

An insulating layer 130 may be arranged on the first surface 117 of the semiconductor chip 110. The insulating layer 130 may have a structure in which a plurality of insulating films are stacked, for example, a first insulating layer 131 and a second insulating layer 133, which are sequentially stacked.

In some embodiments, a thickness of one insulating film constituting the insulating layer 130 may be between about 0.1 micrometers and about 70 micrometers. For example, the thickness of the first insulating layer 131 and the thickness of the second insulating layer 133 each may be between about 0.1 micrometers and 70 micrometers.

In some embodiments, the first insulating layer 131 and the second insulating layer 133 each may include an insulating polymer, epoxy, a silicon oxide film, a silicon nitride film, an insulating polymer, or a combination thereof.

In some embodiments, the first insulating layer 131 and the second insulating layer 133 each may include a non-photosensitive material or a photosensitive material.

In some embodiments, the first insulating layer 131 and the second insulating layer 133, both constituting the insulating layer 130, may include materials different from each other. For example, the first insulating layer 131 may include a non-photosensitive material, for example, a non-photosensitive polyimide, and the second insulating layer 133 may include a photosensitive material, for example, a photosensitive polyimide.

In some embodiments, a coefficient of thermal expansion of the first insulating layer 131 may be different from a coefficient of thermal expansion of the second insulating layer 133. For example, the coefficient of thermal expansion of the first insulating layer 131 may be greater than the coefficient of thermal expansion of the second insulating layer 133. Alternatively, the coefficient of thermal expansion of the first insulating layer 131 may be less than the coefficient of thermal expansion of the second insulating layer 133.

In some embodiments, the first insulating layer 131 may include an upper surface 131U in contact with the second insulating layer 133 and a lower surface 131L opposite to the upper surface 131U and in contact with the first surface 117 of the semiconductor chip 110, and the surface roughness of the upper surface 131U of the first insulating layer 131 may be different from the surface roughness of the lower surface 131L. For example, the surface roughness of the upper surface 131U of the first insulating layer 131 may be greater than the surface roughness of the lower surface 131L. As the upper surface 131U of the first insulating layer 131 is formed to have relatively greater surface roughness, adhesion between the first insulating layer 131 and a first wiring pattern 141 formed on the upper surface 131U of the first insulating layer 131 may be enhanced.

Furthermore, the surface roughness of the first insulating layer 131 may be different from the surface roughness of the second insulating layer 133. For example, the surface roughness of the upper surface 131U of the first insulating layer 131 may be greater than the surface roughness of an upper surface 133U of the second insulating layer 133 and the surface roughness of a lower surface 133L of the second insulating layer 133.

Generally, compared to a case in which an insulating film of a wafer-level package has a thickness of about 5 micrometers, the first insulating layer 131 and/or the second insulating layer 133 may be relatively thick. In some embodiments, the thickness of the first insulating layer 131 and the thickness of the second insulating layer 133 each may be about 10 micrometers or more. For example, the thickness of the first insulating layer 131 may be between about 10 micrometers and about 70 micrometers. Alternatively, the thickness of the first insulating layer 131 may be between about 20 micrometers and about 60 micrometers, or between about 30 micrometers and about 50 micrometers. Furthermore, the thickness of the second insulating layer 133 may be between about 10 micrometers and about 70 micrometers. Alternatively, the thickness of the second insulating layer 133 may be between about 20 micrometers and about 60 micrometers, or between about 30 micrometers and about 50 micrometers. In this state, the thickness of the second insulating layer 133 and the thickness of the first insulating layer 131 may be substantially the same or different from each other.

As the first insulating layer 131 and/or the second insulating layer 133 are formed to be thick, the first insulating layer 131 and/or the second insulating layer 133 may function as buffers to external shocks so that reliability of the semiconductor package 100 may be enhanced. In particular, as the second insulating layer 133 at the outermost side is formed to be thick, stress applied to an external connection terminal 170 between a mounting substrate on which the semiconductor package 100 is mounted and the second insulating layer 133 may be greatly reduced.

The wiring pattern 140 may be electrically connected to the chip pad 111 of the semiconductor chip 110, and may provide an electrical connection path to electrically connect the chip pad 111 to an external device. The wiring pattern 140 may have a multilayer structure and may include, for example, the first wiring pattern 141 and a second wiring pattern 143.

In detail, the first insulating layer 131 may cover the first surface 117 of the semiconductor chip 110, and may have a first via hole 131H for exposing part of the chip pad 111. Part of the first wiring pattern 141 may extend along the upper surface 131U of the first insulating layer 131, and the other part of the first wiring pattern 141 may extend along an inner wall of the first insulating layer 131, which is formed by a via hole 131H of the first insulating layer 131, to be connected to the chip pad 111. Furthermore, the second insulating layer 133 may be formed on the first insulating layer 131 to cover the first wiring pattern 141, and may have a second via hole 133H to expose the part of the first wiring pattern 141. Part of the second wiring pattern 143 may extend along the upper surface 133U of the second insulating layer 133, and the other part of the second wiring pattern 143 may extend along an inner wall of the second insulating layer 133, which is formed by the second via hole 133H of the second insulating layer 133, to be connected to the first wiring pattern 141.

In some embodiments, the second wiring pattern 143 may functions as an external connection pad, and may be, for example, an under bump metal (UBM). The external connection terminal 170 may be arranged on the second wiring pattern 143. The external connection terminal 170 may have a spherical shape or a ball shape, and may be, for example, a solder ball or a solder bump. The external connection terminal 170 may be electrically connected to the chip pad 111 of the semiconductor chip 110 through the wiring pattern 140, and may be configured to electrically connect the semiconductor package 100 to an external device. However, in some embodiments, the second wiring pattern 143 may be omitted, and in this case, the external connection terminal 170 may be directly arranged on the first wiring pattern 141 exposed through the second via hole 133H of the second insulating layer 133.

In some embodiments, the wiring pattern 140 may include a conductive material, for example, W, Cu, Zr, Ti, Ta, Al, Ru, Pd, Pt, Co, Ni, or a combination thereof. Furthermore, the first wiring pattern 141 and the second wiring pattern 143 may include the same material or a combination of the same material, or materials different from each other or a combination of materials different from each other.

In some embodiments, the external connection terminal 170 may cover the second wiring pattern 143 to prevent the second wiring pattern 143 from being exposed to the outside. For example, the external connection terminal 170 may cover an upper surface and a side wall of the second wiring pattern 143. As the external connection terminal 170 is formed to cover the second wiring pattern 143, a contact area between the second wiring pattern 143 and the external connection terminal 170 may increase, and the second wiring pattern 143 may be prevented from being damaged due to the exposure to the outside.

Figure 2:
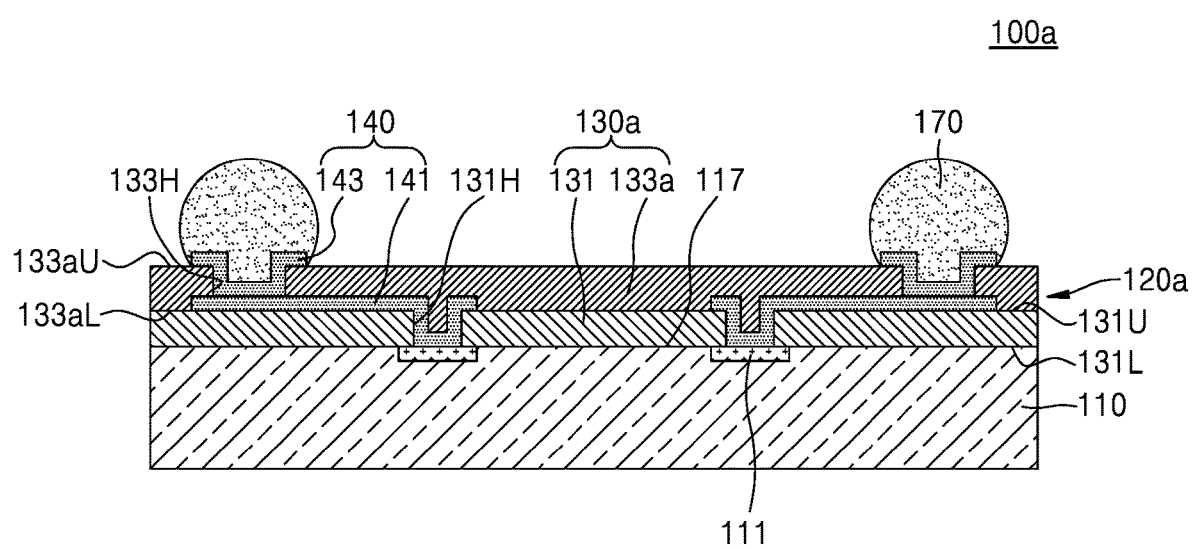
FIG. 2 is a cross-sectional view of a semiconductor package according to an embodiment of the disclosure.

FIG. 2 is a cross-sectional view of a semiconductor package 100a according to an embodiment of the disclosure. The semiconductor package 100a of FIG. 2 may have substantially the same configuration as the semiconductor package 100 of FIG. 1, except the configuration of an insulating layer 130a of a redistribution structure 120a. In FIG. 2, redundant descriptions to those of FIG. 1 are omitted or briefly presented.

Referring to FIG. 2, the first insulating layer 131 and a second insulating layer 133a, both constituting the insulating layer 130a, may include the same material. For example, the first insulating layer 131 and the second insulating layer 133a each may include a non-photosensitive material, for example, a non-photosensitive polyimide.

In some embodiments, the second insulating layer 133a may include an upper surface 133aU and a lower surface 133aL, which are opposite to each other, and the surface roughness of the upper surface 133aU of the second insulating layer 133a may be different from the surface roughness of the lower surface 133aL. For example, the surface roughness of the upper surface 133aU of the second insulating layer 133a may be greater than the surface roughness of the lower surface 133aL. As the upper surface 133aU of the second insulating layer 133a is formed to have a relatively great surface roughness, adhesion between the second insulating layer 133a and the second wiring pattern 143 formed on the upper surface 133aU of the second insulating layer 133a may be enhanced.

FIGS. 3A to 3H are cross-sectional views of a method of manufacturing the semiconductor package 100 of FIG. 1 in order.

Figure 3A:
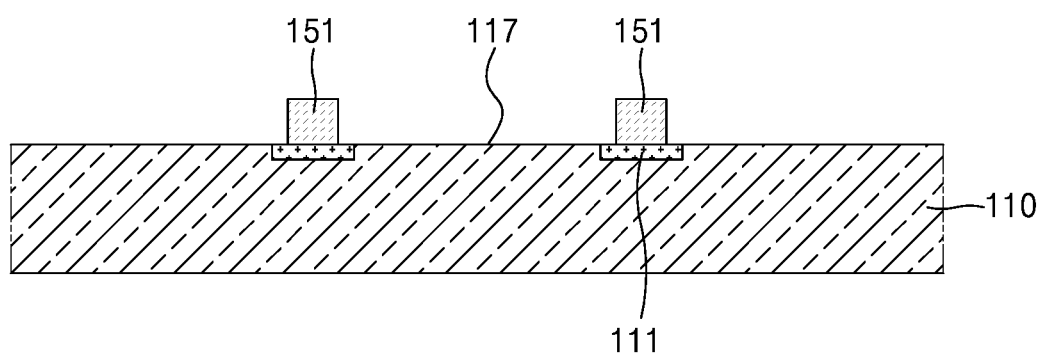
FIGS. 3A to 3H are cross-sectional views of a method of manufacturing the semiconductor package of FIG. 1 in order.

Referring to FIG. 3A, a first sacrifice pattern 151 is formed on the chip pad 111 of the semiconductor chip 110. The first sacrifice pattern 151 for defining an area, in which a first via hole 131H of FIG. 3D described below is formed, may cover at least part of the chip pad 111.

The first sacrifice pattern 151 may have a pillar shape. For example, the first sacrifice pattern 151 may have a height between about 30 micrometers and about 50 micrometers.

In some embodiments, to form the first sacrifice pattern 151, a sacrifice film including photoresist may be formed on the first surface 117 of the semiconductor chip 110 and may perform a patterning process on the sacrifice film.

Figure 3B:
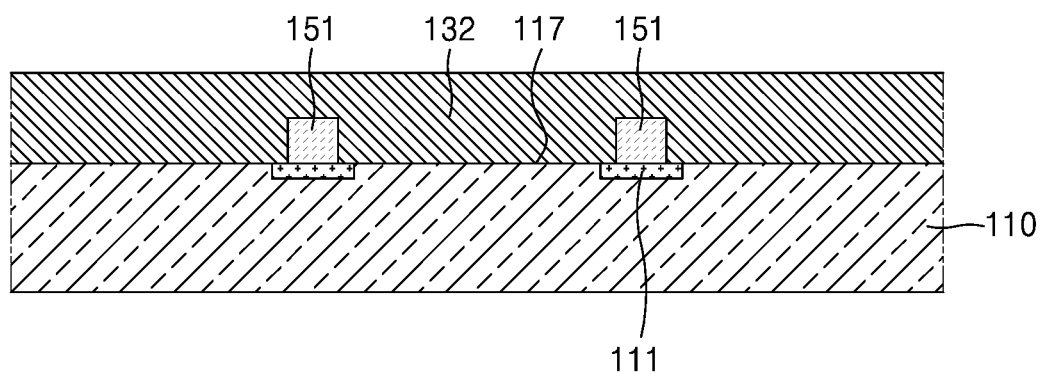

Referring to FIG. 3B, a first insulating film 132 is formed to cover the semiconductor chip 110 and the first sacrifice pattern 151. In some embodiments, the first insulating film 132 may be formed through a film lamination process using insulating a film in a solid state and including a non-photosensitive material. For example, an insulating film in a semi-curing state, that is, a B-stage, is coated on the semiconductor chip 110, and the first insulating film 132 may be formed by performing a pre-curing process.

Generally, when an insulating film is formed by using a material in a liquid state, in a thermal contraction process of a material in a liquid state, relatively large residual stress may be generated in the insulating film. However, according to embodiments of the disclosure, as the first insulating film 132 is formed by using an insulating film in a solid state, the generation of residual stress due to the thermal contraction may be reduced. Furthermore, as the first insulating film 132 is formed by using an insulating film in a solid state, the first insulating film 132 having relatively thick thickness may be easily formed.

However, the method of forming the first insulating film 132 is not limited thereto, and, for example, the first insulating film 132 may be formed by a spin coating process.

Figure 3C:
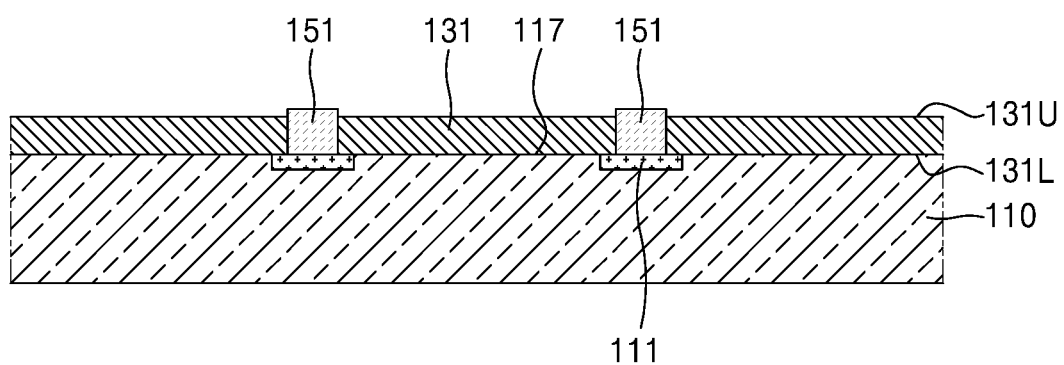

Referring to FIG. 3C, the first insulating layer 131 that exposes at least part of the first sacrifice pattern 151 is formed by removing part of the first insulating film 132 of FIG. 3B. As a result of removing the part of the first insulating film 132, the first sacrifice pattern 151 may protrude from the upper surface 131U of the first insulating layer 131. For example, in order to remove the part of the first insulating film 132, an etch back process or a polishing process may be performed.

As the part of the first insulating film 132 is removed, the first sacrifice pattern 151 may protrude from the first insulating layer 131. In other words, the upper surface 131U of the first insulating layer 131 may be lower than the upper surface of the first sacrifice pattern 151. For example, the height of the first sacrifice pattern 151 protruding from the upper surface 131U of the first insulating layer 131 may be between about 10% and about 40% of the total height of the first sacrifice pattern 151. For example, the height of the first sacrifice pattern 151 protruding from the upper surface 131U of the first insulating layer 131 may be between about 1 micrometer and about 20 micrometers, or between about 5 micrometers and about 15 micrometers.

In some embodiments, the part of the first insulating film 132 may be removed by performing an etch back process. As a result of the etch back process, the upper surface 131U of the first insulating layer 131 may have surface roughness greater than the upper surface of the first insulating film 132 before the etch back process. Furthermore, as a result of the etch back process, the surface roughness of the upper surface 131U of the first insulating layer 131 may be greater than the surface roughness of the lower surface 131L of the first insulating layer 131.

Figure 3D:
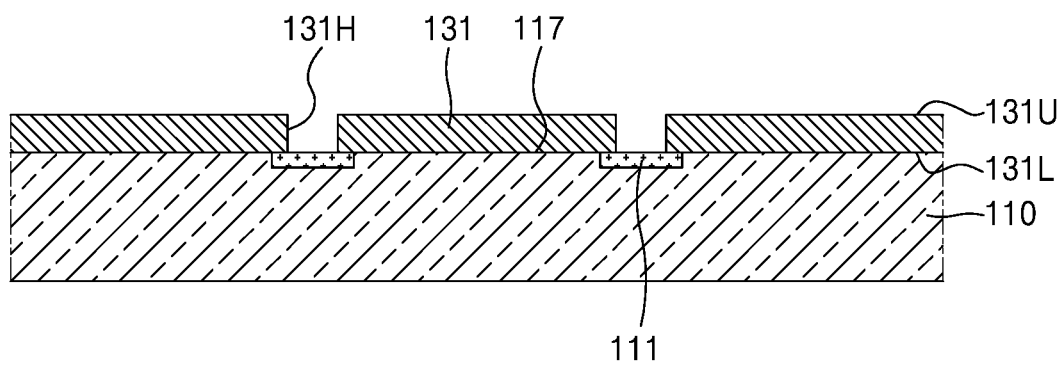

Referring to FIG. 3D, the first sacrifice pattern 151 of FIG. 3C may be removed. For example, in order to remove the first sacrifice pattern 151, a strip process may be performed. As the first sacrifice pattern 151 is removed, the first via hole 131H for exposing the chip pad 111 may be formed. In some embodiments, after the first sacrifice pattern 151 is removed, a curing process may be performed on the first insulating layer 131.

Figure 3E:
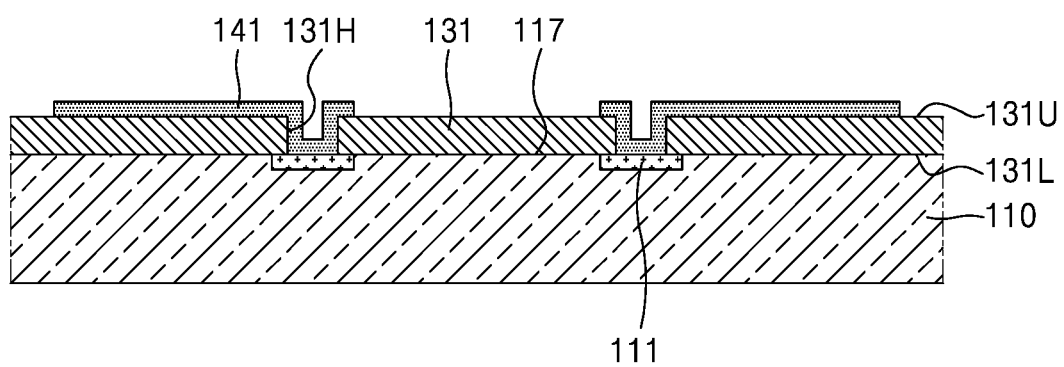

Referring to FIG. 3E, the first wiring pattern 141 is formed on the first insulating layer 131 and the chip pad 111 that is exposed through the first via hole 131H. The first wiring pattern 141 may be formed along a surface of the first insulating layer 131, and may be connected to the chip pad 111 that is exposed through the first via hole 131H of the first insulating layer 131. As described above, as the upper surface 131U of the first insulating layer 131 is formed to have relatively large surface roughness, adhesion between the first wiring pattern 141 and the first insulating layer 131 may be enhanced.

In some embodiments, in order to form the first wiring pattern 141, a seed metal layer may be formed to cover the first insulating layer 131, and a plating process using the seed metal layer as a seed may be performed. For example, the first wiring pattern 141 may be formed through immersion plating, electroless plating, electroplating, or a combination thereof.

Figure 3F:
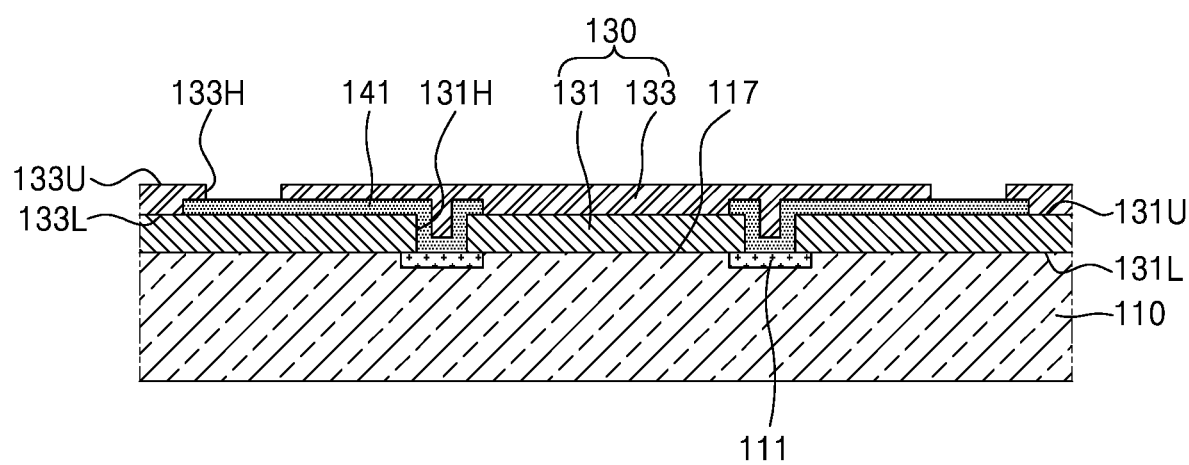

Referring to FIG. 3F, the second insulating layer 133 is formed on the first insulating layer 131. Whiling covering the first wiring pattern 141, the second insulating layer 133 may be formed to have the second via hole 133H that exposes the part of the first wiring pattern 141.

In some embodiments, in order to form the second insulating layer 133, a second insulating film may be formed on the first insulating layer 131, the second via hole 133H may be formed by removing part of the second insulating film. For example, the second insulating film may be formed through a film lamination process using an insulating film including a photosensitive material, and the second via hole 133H may be formed through exposure and development process on the second insulating film.

Figure 3G:
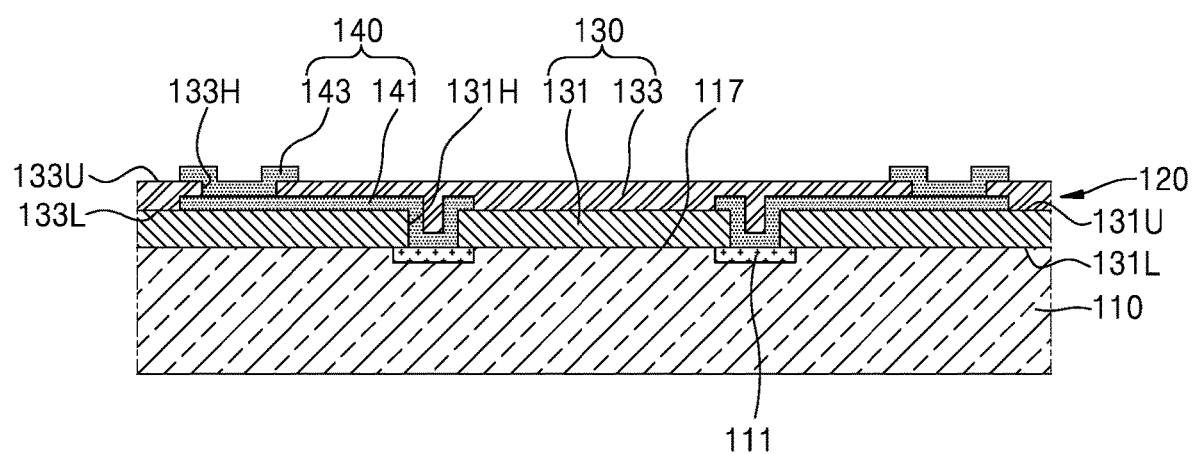

Referring to FIG. 3G, after the second insulating layer 133 is formed, the second wiring pattern 143 is formed on the second insulating layer 133 and the first wiring pattern 141 exposed through the second via hole 133H. The second wiring pattern 143 may be electrically connected to the first wiring pattern 141 exposed through the second via hole 133H of the second insulating layer 133. The second wiring pattern 143 may be formed in a similar manner to the method of forming the first wiring pattern 141 described with reference to FIG. 3E.

Figure 3H:
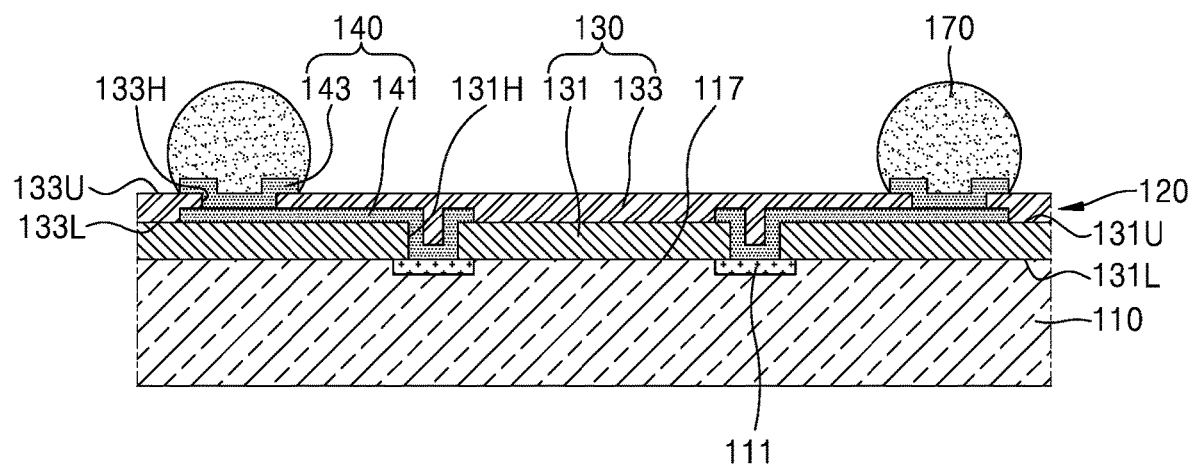

Referring to FIG. 3H, after the second wiring pattern 143 is formed, the external connection terminal 170 may be formed on the second wiring pattern 143.

Thereafter, to individualize a semiconductor package manufactured at a wafer level into a plurality of individual units of semiconductor packages, the wafer-level semiconductor package may be cut along a scribe lane.

FIGS. 4A to 4E are cross-sectional views of a method of manufacturing the semiconductor package 100a of FIG. 2.

Figure 4A:
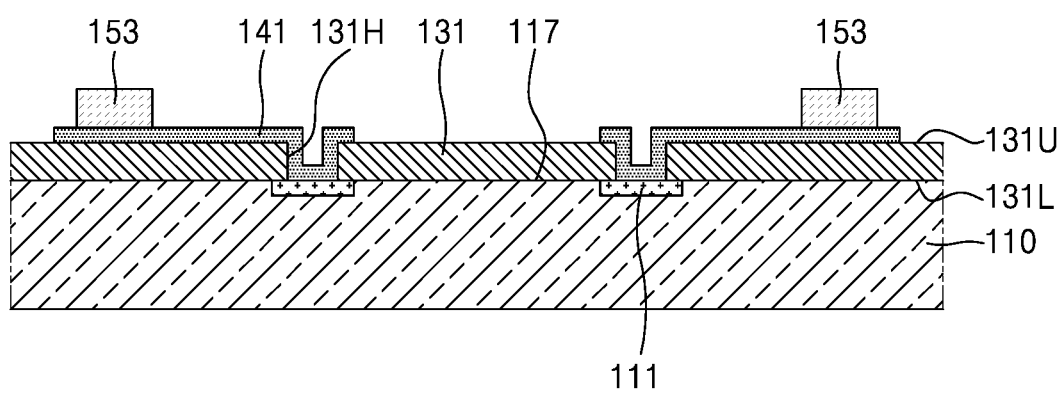
FIGS. 4A to 4E are cross-sectional views of a method of manufacturing the semiconductor package of FIG. 2 in order.

Referring to FIG. 4A, a structure corresponding to a resultant of FIG. 3E is prepared, and a second sacrifice pattern 153 is formed on the first wiring pattern 141 of the structure. The second sacrifice pattern 153 for defining an area in which the second via hole 133H described below is formed may cover part of the first wiring pattern 141.

The second sacrifice pattern 153 may have a pillar shape. For example, a distance between the upper surface of the second sacrifice pattern 153 and the upper surface 131U of the first insulating layer 131 may be between about 30 micrometers and about 50 micrometers.

In some embodiments, to form the second sacrifice pattern 153, a sacrifice film including photoresist may be formed on the first insulating layer 131 and the first wiring pattern 141, and a patterning process may be performed on the sacrifice film.

Figure 4B:
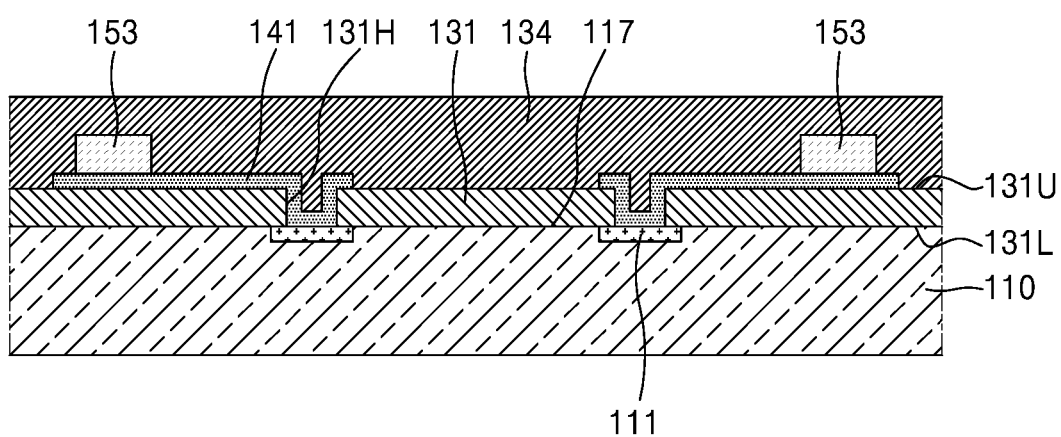

Referring to FIG. 4B, a second insulating film 134 is formed on the first insulating layer 131. The second insulating film 134 may cover the first wiring pattern 141 and the second sacrifice pattern 153. In some embodiments, the second insulating film 134 may be formed through a film lamination process using an insulating film including a non-photosensitive material. However, the method of forming the second insulating film 134 is not limited thereto, and for example, the second insulating film 134 may be formed through a spin coating process.

Figure 4C:
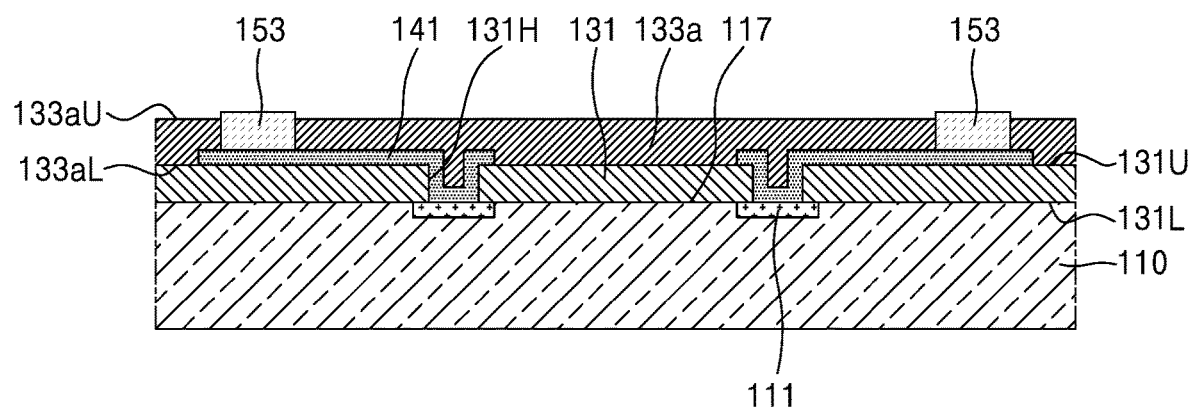

Referring to FIG. 4C, the second insulating layer 133*a* that exposes part of the second sacrifice pattern 153 is formed by removing part of the second insulating film 134 of FIG. 4B. As a result of the removing of the part of the second insulating film 134, the second sacrifice pattern 153 may protrude from the upper surface 133*a*U of the second insulating layer 133*a*, and the upper surface 133*a*U of the second insulating layer 133*a* may be lower than the upper surface of the second sacrifice pattern 153. For example, to remove the part of the second insulating film 134, an etch back process or a polishing process may be performed.

As the part of the second insulating film 134 is removed, the second sacrifice pattern 153 may protrude from the second insulating layer 133*a*. In other words, the upper surface 133*a*U of the second insulating layer 133*a* may be lower than the upper surface of the second sacrifice pattern 153. For example, the height of the second sacrifice pattern 153 protruding from the upper surface 133*a*U of the second insulating layer 133*a* may be between about 10% and about 40% of the total height of the second sacrifice pattern 153. For example, the height of the second sacrifice pattern 153 protruding from the upper surface 133*a*U of the second insulating layer 133*a* may be between about 1 micrometer and about 20 micrometers or between about 5 micrometers and about 15 micrometers.

In some embodiments, the part of the second insulating film 134 may be removed by performing an etch back process. By the etch back process, the upper surface 133*a*U of the second insulating layer 133*a* may have surface roughness greater than the upper surface of the second insulating film 134 before the etch back process. Furthermore, by the etch back process, the surface roughness of the upper surface 133*a*U of the second insulating layer 133*a* may be greater than the surface roughness of the lower surface 133*a*L of the second insulating layer 133*a*.

Figure 4D:
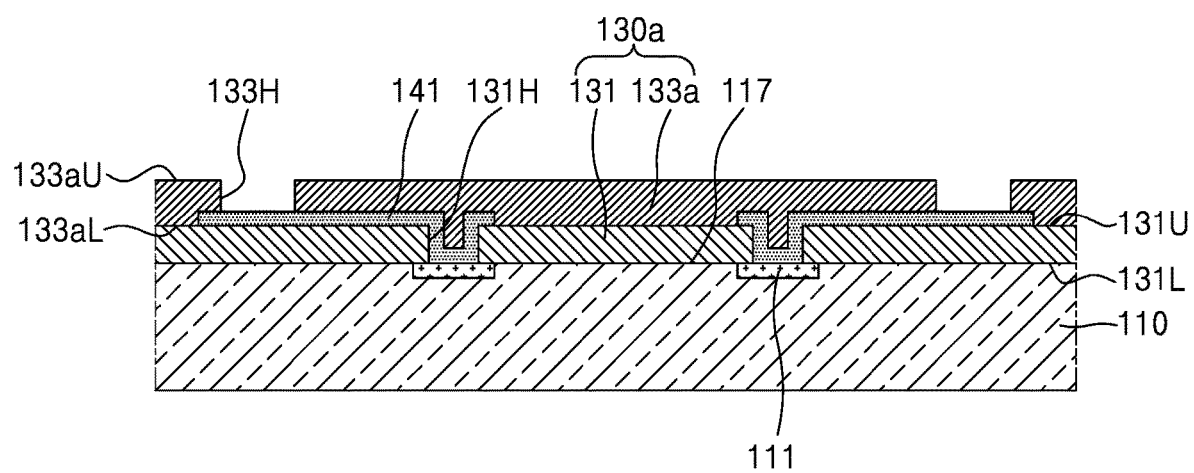

Referring to FIG. 4D, the second sacrifice pattern 153 of FIG. 4C may be removed. For example, to remove the second sacrifice pattern 153, a strip process may be performed. As the second sacrifice pattern 153 is removed, the second via hole 133H that exposes the first wiring pattern 141 may be formed. In some embodiments, after the second sacrifice pattern 153 is removed, a curing process may be performed on the second insulating layer 133*a*.

Figure 4E:
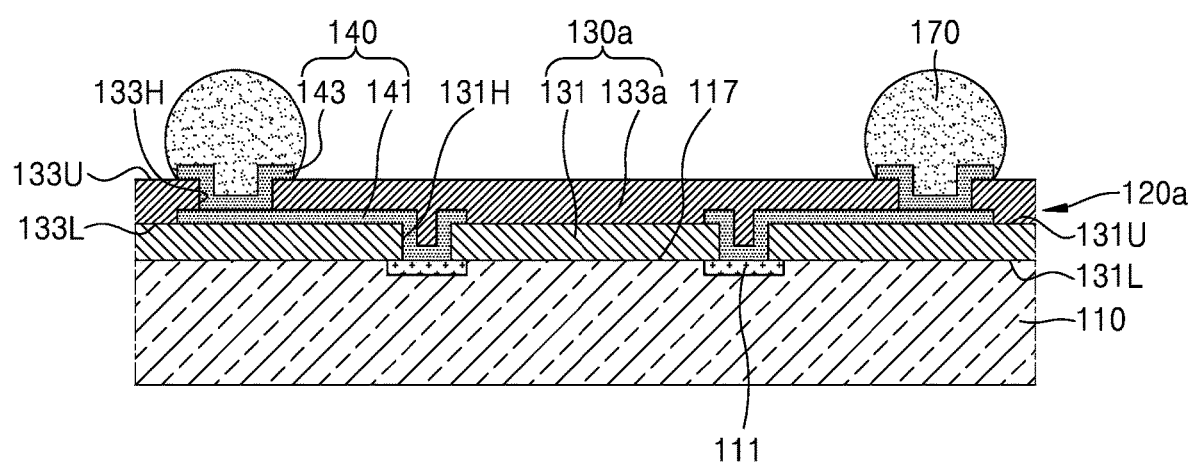

Referring to FIG. 4E, after the second via hole 133H is formed, the second wiring pattern 143 is formed on the second insulating layer 133. The second wiring pattern 143 may be electrically connected to the first wiring pattern 141 that is exposed through the second via hole 133H of the second insulating layer 133. As described above, as the upper surface 133*a*U of the second insulating layer 133*a* is formed to have relatively large surface roughness, adhesion between the second wiring pattern 143 and the second insulating layer 133*a* may be enhanced.

After the second wiring pattern 143 is formed, the external connection terminal 170 may be formed on the second wiring pattern 143. Thereafter, to individualize a semiconductor package manufactured at a wafer level into a plurality of individual units of semiconductor packages, the wafer-level semiconductor package may be cut along a scribe lane.

Figure 5:
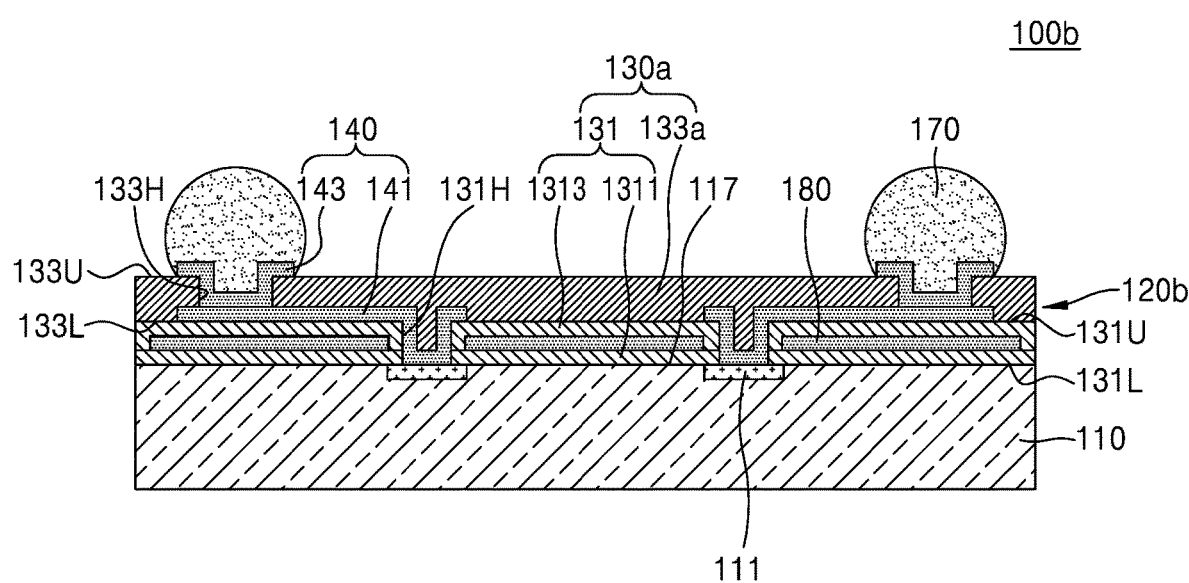
FIG. 5 is a cross-sectional view of a semiconductor package according to an embodiment of the disclosure.

FIG. 5 is a cross-sectional view of a semiconductor package 100*b* according to an embodiment of the disclosure.

Figure 6A:
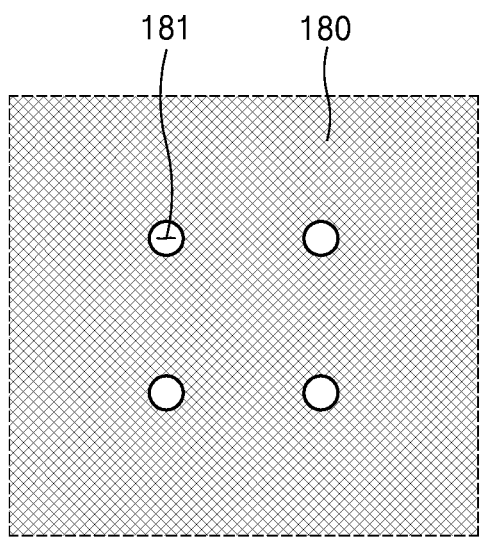
FIGS. 6A and 6B are plan views of a shield layer of FIG. 5.
Figure 6B:
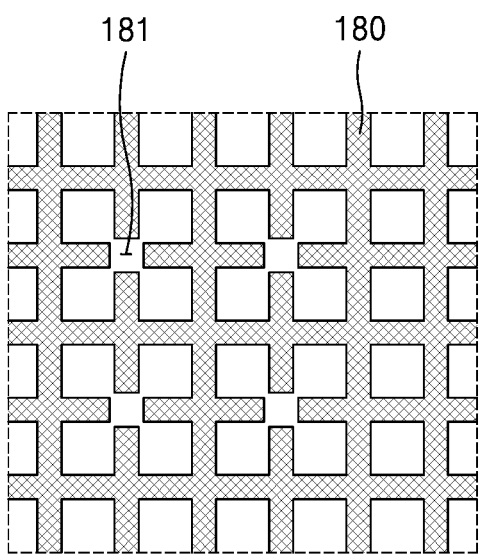

FIGS. 6A and 6B are plan views of a shield layer 180 of FIG. 5. The semiconductor package 100*b* of FIG. 5 may have substantially the same configuration as the semiconductor package 100*a* of FIG. 2, except that a redistribution structure 120*b* further includes a shield layer 180. In FIGS. 5, 6A, and 6B, redundant descriptions to the previously described contents are omitted or briefly presented.

Referring to FIG. 5, the redistribution structure 120*b* may include the shield layer 180. The shield layer 180 is arranged on the semiconductor chip 110 to shield electromagnetic interference (EMI), thereby preventing degradation of performance of the semiconductor chip 110 due to EMI. For example, the shield layer 180 may include a conductive material such as copper (Cu), silver (Ag), platinum (Pt), and the like.

For example, as the shield layer 180 may be provided in the first insulating layer 131 and may be spaced apart from the first wiring pattern 141. For example, the first insulating layer 131 may include a first sub-insulating layer 1311 and a second sub-insulating layer 1313, which are sequentially stacked on the first surface 117 of the semiconductor chip 110. The shield layer 180 may be formed between the first sub-insulating layer 1311 and the second sub-insulating layer 1313. In some embodiments, as the first insulating layer 131 is formed to be thick, the shield layer 180 may be further formed without an increase in thickness of the redistribution structure 120*b*.

Although FIG. 5 illustrates that the shield layer 180 is arranged in the first insulating layer 131, the disclosure is not limited thereto. For example, a second shield layer may be formed in the second insulating layer 133*a*. For example, when a second shield layer is formed in the second insulating layer 133*a*, the second insulating layer 133*a* may include a third sub-insulating layer and a fourth sub-insulating layer, which are sequentially stacked on the first insulating layer 131, and the second shield layer may be arranged between the third sub-insulating layer and the fourth sub-insulating layer and may be spaced apart from the second wiring pattern 143.

In some embodiments, as illustrated in FIG. 6A, while having a plate shape, the shield layer 180 may include an opening portion 181 through which the first wiring pattern 141 extending along the first via hole 131H passes.

Alternatively, in some embodiments, as illustrated in FIG. 6B, while having a mesh shape, the shield layer 180 may include the opening portion 181 through which the first wiring pattern 141 extending along the first via hole 131H passes.

While the disclosure has been particularly shown and described with reference to preferred embodiments using specific terminologies, the embodiments and terminologies should be considered in descriptive sense only and not for purposes of limitation. Therefore, it will be understood by those of ordinary skill in the art that various changes in form and details may be made therein without departing from the spirit and scope of the disclosure as defined by the following claims.

The invention claimed is:

1. A semiconductor package comprising:
   a semiconductor chip comprising a chip pad;
   a first insulating layer provided on the semiconductor chip and comprising a first via hole;
   a first wiring pattern provided on the first insulating layer and connected to the chip pad through the first via hole of the first insulating layer;

a second insulating layer provided on the first insulating layer and the first wiring pattern and comprising a second via hole; and a second wiring pattern provided on the second insulating layer and connected to the first wiring pattern through the second via hole of the second insulating layer, wherein the first insulating layer comprises a first upper surface including a first portion in contact with the second insulating layer and a second portion in contact with the first wiring pattern, and a first lower surface opposite to the first upper surface, and each of the first portion and the second portion of the first upper surface of the first insulating layer has surface roughness greater than the first lower surface of the first insulating layer.

2. The semiconductor package of claim 1, wherein a thickness of the first insulating layer is between about 0.1 micrometers and about 70 micrometers.

3. The semiconductor package of claim 2, wherein the thickness of the first insulating layer is about 10 micrometers or more.

4. The semiconductor package of claim 1, wherein the second insulating layer comprises a second upper surface and a second lower surface opposite to the second upper surface and in contact with the first insulating layer, and the second upper surface of the second insulating layer has surface roughness greater than the second lower surface of the second insulating layer.

5. The semiconductor package of claim 4, wherein a thickness of the second insulating layer is between about 0.1 micrometers and 70 micrometers.

6. The semiconductor package of claim 1, wherein
the first insulating layer comprises a non-photosensitive material, and
the second insulating layer comprises a photosensitive material.

7. The semiconductor package of claim 1, further comprising
an external connection terminal provided on the second wiring pattern, and
the external connection terminal covers a side wall of the second wiring pattern.

8. The semiconductor package of claim 1, further comprising a shield layer provided in the first insulating layer and spaced apart from the first wiring pattern.

9. The semiconductor package of claim 8, wherein the shield layer has a plate shape and comprises an opening portion through which the first wiring pattern passes.

10. The semiconductor package of claim 8, wherein the shield layer has a mesh shape and comprises an opening portion through which the first wiring pattern passes.

* * * * *